(12) United States Patent
Westra et al.

(10) Patent No.: US 6,426,715 B1
(45) Date of Patent: Jul. 30, 2002

(54) DIGITAL TO ANALOG CONVERTER

(75) Inventors: Jan Roelof Westra, Amstelveen; Anne Johan Annema, Eindhoven, both of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/698,762

(22) Filed: Oct. 27, 2000

(30) Foreign Application Priority Data

Oct. 27, 1999 (EP) .............................................. 99203538

(51) Int. Cl.[7] .............................. H03M 1/06; H03M 1/72

(52) U.S. Cl. ....................................... 341/144; 341/118

(58) Field of Search ................................. 341/131, 150, 341/118, 120, 143, 144, 155, 163

(56) References Cited

U.S. PATENT DOCUMENTS

| | | | |
|---|---|---|---|
| 3,982,172 A | | 9/1976 | Van De Plassche ............. 323/1 |
| 4,703,310 A | | 10/1987 | Van De Plassche .......... 340/347 |
| 4,972,188 A | * | 11/1990 | Clement et al. ............. 341/118 |
| 5,406,283 A | * | 4/1995 | Leung .......................... 341/143 |
| 5,689,259 A | | 11/1997 | Ozguc ......................... 341/144 |
| 5,856,799 A | * | 1/1999 | Hamasaki et al. ........... 341/144 |
| 6,211,805 B1 | * | 4/2001 | Yu .............................. 341/155 |

* cited by examiner

*Primary Examiner*—Patrick Wamsley
(74) *Attorney, Agent, or Firm*—Aaron Waxler (57) ABSTRACT

A digital to analog converter for a multibit digital input signal has a set of conversion elements for the positive signal excursions and a set of conversion elements for the negative signal excursions. In each set the conversion elements are selected according to a dynamic element matching algorithm. To improve the mismatch-noise shaping of these algorithms, excess conversion elements may be additionally selected.

4 Claims, 5 Drawing Sheets

DIGITAL TO ANALOG CONVERTER

This invention relates to a digital to analog converter for converting a multibit digital input signal into an analog output signal, the converter comprising a set of substantially equal conversion elements of one polarity and conversion element selection logic for selecting, in response to the multibit digital input signal, from said set of conversion elements a number of signal-conversion elements for connection to an output terminal, the selection logic being adapted to perform a dynamic element matching algorithm. A digital to analog converter of this kind is e.g. known from the article: "Linearity Enhancement of Multibit Delta Sigma A/D and D/A Converters Using Data Weighted Averaging" by R. T. Baird and T. S. Fiez in IEEE Transactions on Circuits and Systems-II: analog and digital signal processing, Vol. 42, No. 12, pp. 753–762, December 1995.

In audio and instrumentation applications, where low-frequency, high-resolution and high-linearity conversion is required, oversampling and noise-shaping A/D and D/A converters have displaced the traditional architectures. In these converters, single-bit A/D and D/A converters can be used which inherently have an extremely good linearity. This inherent linearity makes these converters very suitable for implementation in modern IC processes, as these processes generally tend to be optimized for high-frequency devices, but have relatively large component variations and matching tolerances.

Although the quantization noise that is produced by single-bit converters is placed outside the frequency band of interest by these oversampling and noise-shaping converters, the total amount of quantization noise is very large, as only one bit is used in the conversion. In converters where an extremely high-resolution conversion is required, such as geoseismic measurements or high-resolution audio, the quantization noise produced by these single-bit converters can be too large. Also, in converters for very large bandwidths, such as converters for video signals, the quantization noise produced by these single-bit converters can be too large, as the oversampling ratio in this type of converter is limited, due to the relatively large bandwidth of the input signal. Moreover, very often the out-of-band quantization noise has to be removed before the signal can be processed by the following electronic circuitry or actuator. When the amount of out-of-band quantization noise is very large, the analog filters that are required for this operation can be very power consuming and very expensive in silicon area.

In these cases, the use of multibit converters is preferred over single-bit converters. The quantization-noise level of the multibit quantizers is inherently lower than that of single-bit quantizers (the theoretical signal to noise ratio of the system improves by approximately 6 dB per bit). Moreover, multibit converters also have the advantage of being less sensitive to sample-clock jitter and intersymbol interference.

The improvement of the dynamic range of multibit converters however only comes at the cost of severe linearity problems. When the value of the conversion elements is not exactly equal, the quantization levels are not exactly equidistant, the converter is nonlinear and severe harmonic distortion in the output signal is generated.

It is well known in the art, e.g. from the U.S. Pat. Nos. 3,982,172 and 4.703.310 of R. J. van de Plassche, to improve the linearity of multibit converters by techniques of dynamic element matching. These techniques do not rely on analog accuracies and are therefore often preferred in modern IC processes. Although, of course, for converting a certain value of the digital input signal, the corresponding number of conversion elements is selected, the technique of dynamic element matching seeks to avoid that for each conversion, the same conversion elements are selected. Therefore dynamic element matching decorrelates the mismatch errors of the conversion elements from the input signal, thereby reducing non-linear distortion, i.e. the generation of higher harmonics in the analog output signal. Some special kinds of dynamic element matching do not only decorrelate the mismatch errors from the input signal, but additionally "shape" the noise, caused by the inequalities of the conversion elements, out of the frequency band of interest. A simple and preferred method of dynamic element matching, belonging to this latter category, is the Data Weighted Averaging (DWA) algorithm, which is described in the above referenced article. In this algorithm, for each conversion the next K unit elements are used, K being the number of elements to be selected. In this way, the error that is caused by the mismatch is averaged as fast as possible, and thus the mismatch error becomes a high-frequency error by first-order shaping.

When both the converter's quantization noise is reduced by the use of multibit input signal and the linearity errors are minimized by the use of dynamic element matching, the noise of the electronic components is often dominant. The present invention has for its object to provide a digital to analog converter which is, compared with the above referenced article, in this respect improved and the digital to analog converter of the present invention is therefore characterized in that the converter further comprises a second set of substantially equal opposite-polarity conversion elements for output-signal excursions which are opposite to the output-signal excursions obtained by the first mentioned set of conversion elements and second conversion-element selection logic for selecting, in response to the multibit digital input signal, from said second set of conversion elements a second number of signal-conversion elements for connection to the said output terminal, the second selection logic being also adapted to perform a dynamic element matching algorithm. The noise reduction of this converter is mainly based on the following: when the converter has to deliver a value close to "zero", no or only few elements are selected in each of the two sets to deliver the analog output. As the contribution of the selected elements is relatively small, as compared to the full-scale output signal, the noise at the output of this converter can be much smaller. Therefore, the dynamic range of such a converter can be much larger than that of many other converters.

It may be observed, that dual-set digital to analog converters are known per se e.g. from U.S. Pat. No. 5,689,259. The digital to analog converter shown in this document does, however, neither show the use of a dynamic element matching algorithm, nor the use of substantially equal selectable conversion elements.

With the above described digital to analog converter, with two sets of conversion elements, one for the positive signal excursions and one for the negative signal excursions, the shaping of the linearity errors by the dynamic element matching algorithm appears to be less efficient than with a converter of only one set of conversion elements for both the positive and the negative signal excursions. This is caused by the fact that the dynamic element matching algorithm that is applied to the "positive" set of elements stops when a negative signal excursion is made, because no elements of this set of elements are selected for contributing to the output signal and equally that the dynamic element matching algorithm for the "negative" set of elements stops when a positive signal excursion is made. When a dynamic element matching algorithm temporarily stops, a larger period of time elapses between the mismatch errors, with the result that the algorithm can no longer shape the mismatch errors to higher frequencies and that low-frequency errors now appear as a noisy signal within the frequency band of interest. It is a further object of the invention to avoid these low-frequency errors in dual conversion-set converters and the digital to analog converter of the present invention may be further characterized in that the first mentioned selection logic additionally selects, from said first mentioned set of conversion elements, a number of excess conversion elements for connection to the output terminal and that the second selection logic additionally selects, from the second set of conversion elements, an equal number of excess conversion elements for connection to the output terminal. Basically, the selection of excess conversion elements cause the dynamic element matching algorithms to continue their operation, thereby preventing the occurrence of low-frequency mismatch errors.

It has to be observed, that the number of excess conversion elements during positive signal excursions may be different from the number of excess conversion elements during negative signal excursions. It is even possible that the number of excess elements differ from sample to sample. However, in a preferred embodiment of this digital to analog converter, the number of excess conversion elements is constant and equal to 1 both during positive and during negative signal excursions. This choice enables good dynamic element matching and good thermal noise performance, as only few conversion elements are connected to the output of the converter when small signals have to be converted. When the number of excess elements is larger than 1, more noise is added to the output. However in some cases it can be favourable for the performance of the dynamic element matching algorithm to choose the number of excess conversion elements to be larger than 1.

In the present application, the term "signal-conversion element" is used to identify those conversion elements, which are selected to constitute the analog output signal, in contradistinction to the "excess conversion elements" which are selected to avoid the temporary stops of the dynamic element matching algorithm.

In the dual-set digital to analog converter of the present invention positive signal excursions are made by the "positive" set of conversion elements and negative excursions are made by the "negative" set. When the average value of the conversion elements in one set is not exactly equal to the average value of the elements in the other set, the circuit is not symmetrical, resulting in even order harmonic distortion in the output signal. In the dual-set digital to analog converter wherein the mismatch errors caused by the differences in the conversion elements within one set are solved by the dynamic element matching algorithm, this additional problem may be solved in a digital to analog converter with a differential analog output without increasing the number of sets of elements and the digital to analog converter of the present invention may therefore be further characterized in that the first mentioned selection logic additionally controls the second set of conversion elements, whereby, simultaneously with the connection of the first mentioned number of signal-conversion elements from the first set to the first mentioned output terminal, an equal number of signal-conversion elements is selected from the second set of conversion elements for connection to the second output terminal and that the second selection logic additionally controls the first mentioned set of conversion elements, whereby, simultaneously with the connection of the second number of signal-conversion elements from the second set to the first mentioned output terminal, an equal number of signal-conversion elements from the first set is selected for connection to the second output terminal.

In this differential-output digital to analog converter, notwithstanding the fact that each set of conversion elements operates during both the positive and the negative signal excursions, the ineffectiveness of the dynamic element matching algorithms still exists, because the selection of signal-conversion elements towards a particular output terminal temporarily stops when the signal-conversion elements are selected for connection to the other output terminal. To overcome this problem the dual-set differential-output analog to digital converter of the present invention may be further characterized in that the first mentioned selection logic additionally selects, from said first mentioned set of conversion elements a first number of excess conversion elements for connection to the first mentioned output terminal, that the first mentioned selection logic additionally selects, from said second set of conversion elements a second number of excess conversion elements for connection to the second output terminal, that the second selection logic additionally selects, from said second set of conversion elements a third number of excess conversion elements for connection to the first mentioned output terminal, that the second selection logic additionally selects, from said first mentioned set of conversion elements a fourth number of excess conversion elements for connection to the second output terminal and that the sum of the first number of excess conversion elements and the second number of excess conversion elements is equal to the sum of the third number of excess conversion elements and the fourth number of excess conversion elements.

The dynamic element matching algorithms of the two selection logics run through the set of conversion elements with different velocities, which implies that from time to time both selection logics are scheduled to simultaneously select the same conversion element. This problem may e.g. be solved by causing one of the selection logics to shift its selection to the first next conversion element which is not selected by the other selection logic. However, such solution is a violation of the proper operation of the dynamic element matching algorithm, because a conversion element with the wrong error is selected and moreover it is difficult to implement. It is a still further object of the invention to overcome this problem in a simpler and better way and the digital to analog converter of the present invention is therefore characterized by means to compare the operation of the two selection logics with each other to identify any conversion element which is scheduled for simultaneous selection by both selection logics and to cancel the selection of such conversion element by each of the two selection logics.

These and other aspects of the invention will be further explained with reference to the attached figures. Herein shows.

Figure 1:
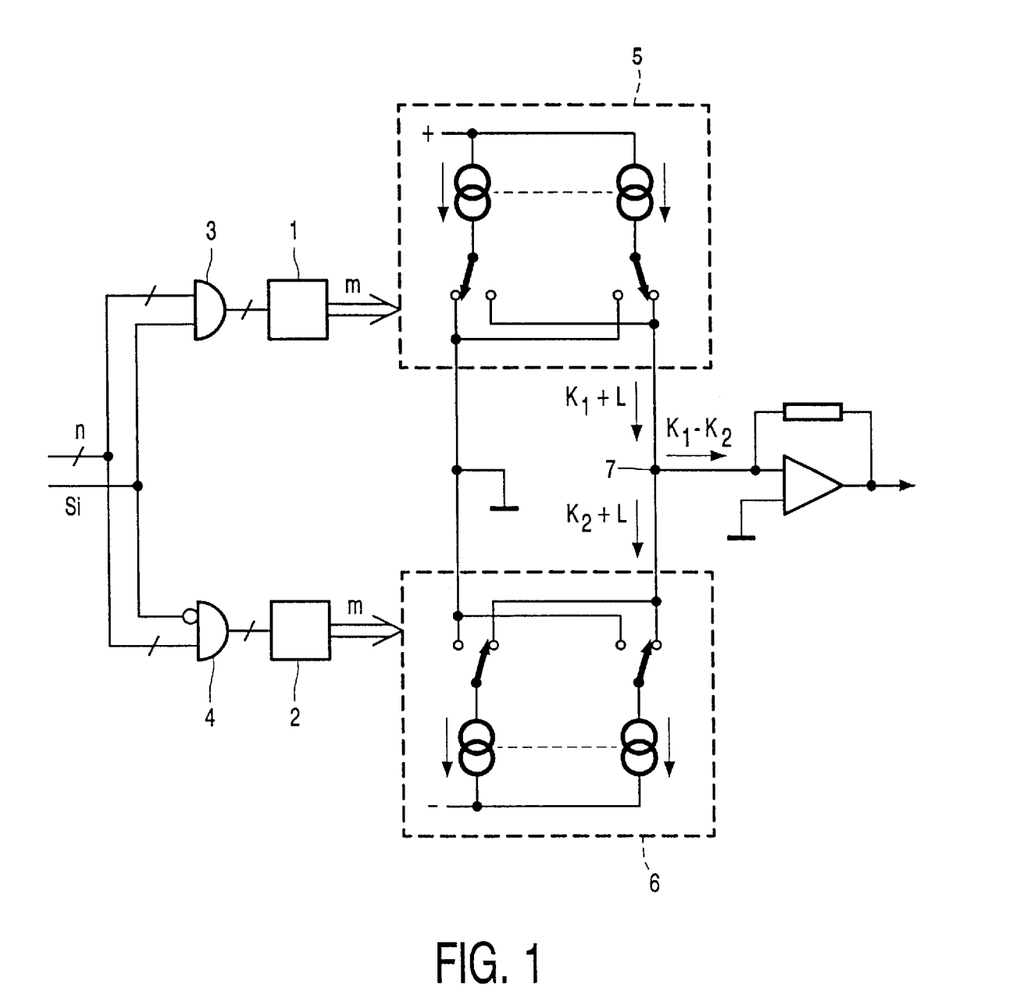
FIG. 1 a first embodiment of a digital to analog converter of the invention.

The digital to analog converter of FIG. 1 comprises a first conversion element selection logic 1 and a second conversion element selection logic 2, which are both controlled by a multibit digital input signal Si. The input signal Si has n+1 bits, of which one bit represents the sign (positive or negative) of the signal and the remaining n bits represent the magnitude of the signal. The sign bit controls an AND gate 3 which passes the n magnitude bits to the selection logic 1 when the sign bit is 1. Furthermore the sign bit controls an inverter and AND gate 4 which passes the magnitude bits to the selection logic 2 when the sign bit is zero. The selection logic 1 is connected through a plurality of m lines to a first set 5 of m selectable conversion elements whereby each of the m conversion elements is controlled by one of the m lines. Equally is the selection logic 2 connected through m lines to a second set 6 of m selectable conversion elements. The conversion elements of the sets 5 and 6 are preferably constituted as current sources (as shown in FIG. 1) whereby the current sources of the set 5 are current supplying sources and those of the set 6 are current sinking sources. However it is also possible to use e.g. voltage sources or capacitances as conversion elements.

The number m of selectable conversion elements per set is at least equal to $2^n-1$ and the primary function of each selection logic is to convert the value represented by the magnitude bits of the input signal to a corresponding number of selected lines and of selected conversion elements. Therefore, when the value represented by the input signal is +K1, which means that the sign bit is 1 and the n remaining bits of the input signal represent the magnitude K1, then the selection logic 1 makes K1 of its m output lines high so that K1 current sources of the set 5 are selected. The summed current K1 of these selected current sources is fed to an output terminal 7. It may be observed that the addition "+L" to the currents K1 and K2 in FIG. 1 will be explained with reference to FIG. 2b. Correspondingly, when the value represented by the input signal is −K2, which means that the sign bit is 0 and the n remaining bits of the input signal represent the magnitude K2, then the selection logic 2 makes K2 of its output lines high so that K2 current sources of the set 6 are selected. The summed current K2 of these selected current sources is sunk from the output terminal 7. Therefore the total analog output current derived from the output terminal 7 is K1−K2. In the embodiment of FIG. 1 this analog output current is fed to an operational amplifier which is fed back through a resistor. This arrangement converts the analog output current into an analog output voltage. It is noted that the currents of the not-selected sources of the sets 5 and 6 are dumped to ground. The alternative, namely switching the sources on and off, is not preferred because the switching off of a current source gives substantially more delay, with less steep edges, than redirecting the current of the source.

As already described in the introductory part of this application, the main advantage of the dual-set digital to analog converter is that at low values of the signal to be converted, i.e. at signal values at which noise is most noticeable, only a low amount of current sources is selected, with a correspondingly low amount of noise contributed by these selected sources. For instance, when the input value is +1, only one current source of set 5 is selected and when the input value is −1, only one source of set 6 is selected.

Figure 2A:
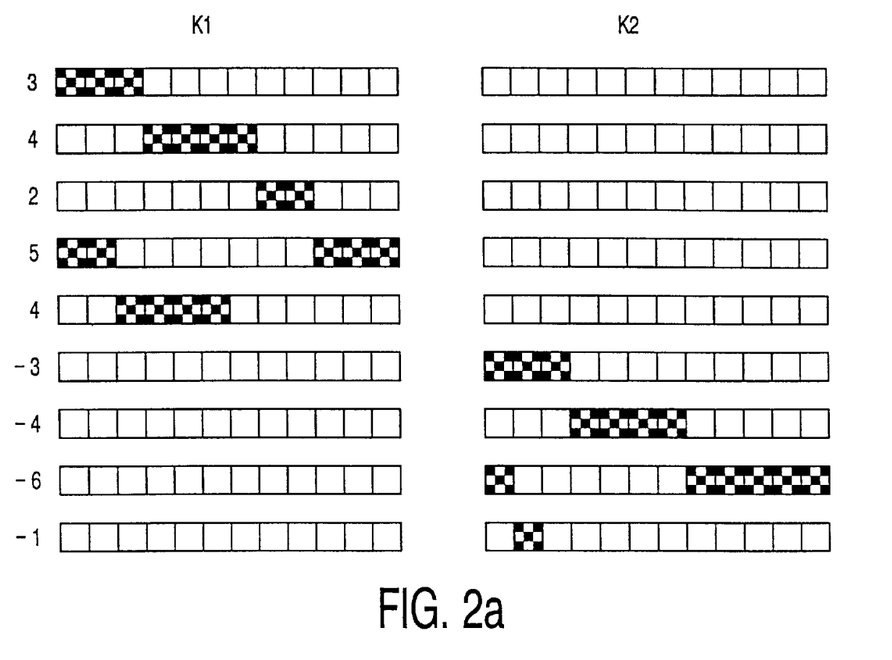
FIGS. 2a and 2b conversion element selection schemes illustrating the operation of the embodiment of FIG. 1, FIG. 3 a second embodiment of a digital to analog converter of the invention and FIG. 4 a conversion element selection scheme illustrating the operation of the embodiment of FIG. 3.

Each of the two selection logics 1 and 2 carries out a dynamic element matching algorithm, with the object to reduce non-linear distortion of the signal and to shape the noise, which is caused by the mismatch between the current sources, to higher frequencies outside the frequency band of interest. A simple, efficient and well known dynamic element matching algorithm, which is called "Data Weighted Averaging" (DWA) is used in the embodiment of FIG. 1 and illustrated in the selection scheme of FIG. 2a for a particular input signal sequence 3,4,2,5,4,−3,−4,−6,−1. In this figure the left column shows the selection scheme for the current sources in the "positive" set 5 and the right column shows the selection scheme for the current sources in the "negative" set 6. The selected current sources are displayed blocked and the non-selected current sources are displayed blank. As shown, the number of selected conversion elements corresponds with the magnitude of the input signal to be converted. However, instead of restarting each conversion with the first current source, each conversion is now started with the current source next to the last source selected during the previous conversion. When during a conversion, the last current source in the row of sources is selected, the conversion continues, in a cyclically permuting fashion, with the first one. In FIG. 2a 12 conversion elements are shown, but in practice each other number of conversion elements per set may be used, e.g. 31.

Normally the "Data Weighted Averaging" is a preferred algorithm for selecting the conversion elements because it ensures that all the conversion elements come in for selection equally long and that the conversion elements come in for selection as frequently as possible. However a problem arises in applying this algorithm in the dual conversion-set arrangement of FIG. 1. This is due to the fact that during negative signal excursions (sign-bit=0) the number of conversion elements to be selected in the "positive" set 5 is zero (K1=0), with the result that the Data Weighted Averaging algorithm for this set of conversion elements stops. This means that any mismatch error which still exists at the beginning of the stop, is not compensated before the end of the stop, so that the mismatch noise is not shaped to higher frequencies but remains in the lower frequency band where the signal frequencies of interest are. Of course the same effect occurs during positive signal excursions because of the temporary stops of the Data Weighted Averaging algorithm in the "negative" set 6. The result is that the mismatch noise in the frequency band of interest is usually much higher than in case the "Data Weighted Averaging" algorithm is used in a single conversion-set system.

The solution to this problem consists in that during positive signal excursions for each conversion, instead of K1 sources, K1+L sources are selected in the "positive" set 5 and L sources in the "negative" set 6. In the same way are, during negative signal excursions, for each conversion, instead of K2 sources, K2+L sources selected from the "negative" set 6 and L sources from the "positive" set 5. In other words: In set 5 are K1+L sources selected and in set 6 K2+L sources, where K1 is zero during negative signal excursions and K2 is zero during positive signal excursions. The output of the digital to analog converter is still K1−K2., but, due to the L excess sources, the dynamic element matching algorithm of the "positive" set is continued during negative signal excursions and the algorithm of the "negative" set is continued during positive signal excursions, thereby preventing low-frequency mismatch errors.

The parameter L can of course be varied, but preferably L is equal to 1 because this enables good dynamic element matching and good thermal noise performance, as the number of sources selected is still low at low signal values.

Figure 2B:
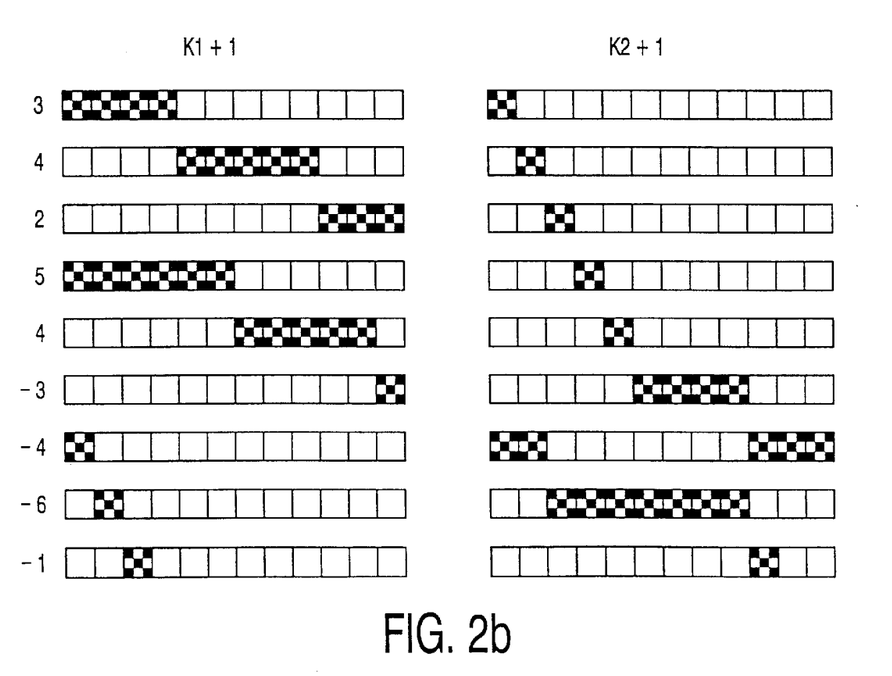

FIG. 2b shows the selection scheme of the two sets of conversion elements for L=1 and for the same sequence of input values as in FIG. 2a. It has to be noted that the total number of conversion elements in each set has to be increased by L in order for the set to be able to convert the maximum value of the input signal.

Figure 3:
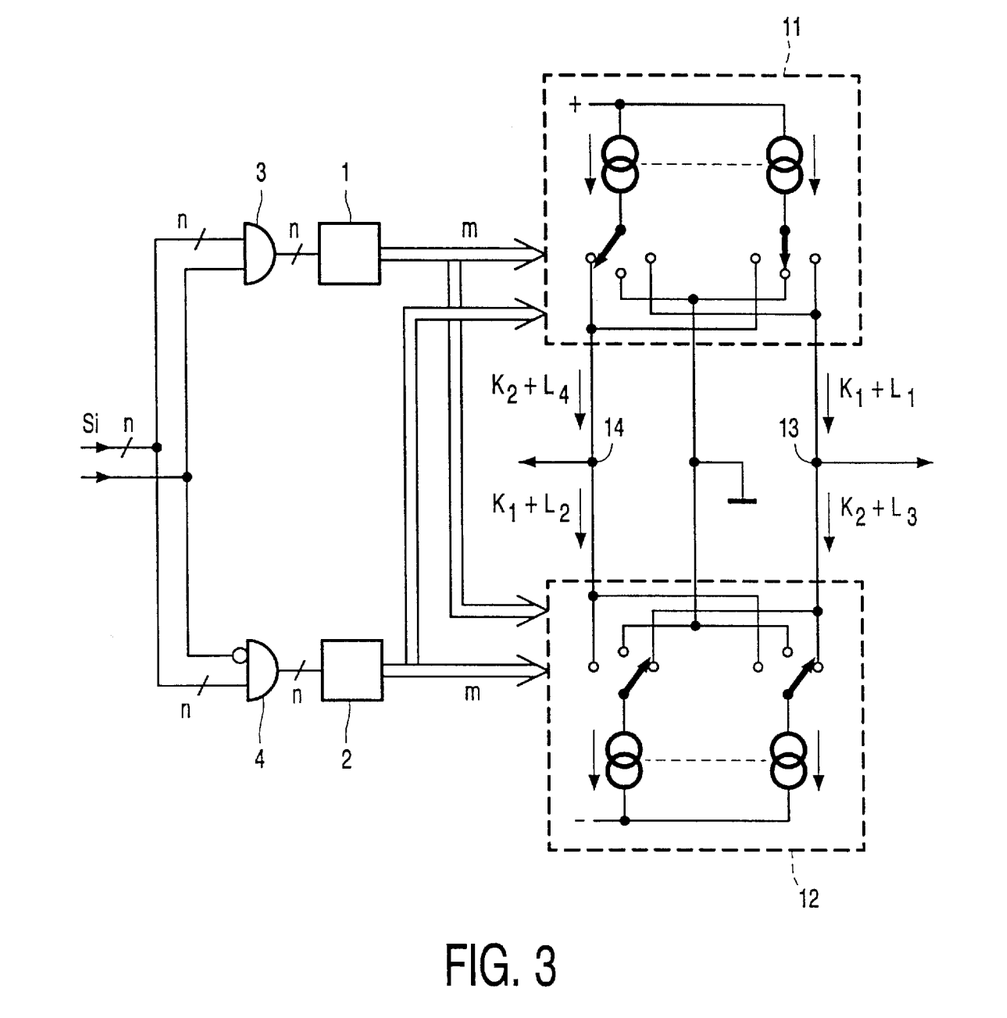

In the digital to analog converter of FIG. 3 the blocks, which have the same function as those in FIG. 1, have the same reference numerals and will not be further discussed. The converter of FIG. 3 comprises a first set of conversion elements 11 and a second set 12. The conversion elements of the first set 11 are again selected by the selection logic 1 but they are simultaneously selected by the selection logic 2. Therefore, while selection logic 1 selects K1 elements of the set 11 according to its dynamic element matching algorithm (as it did in the arrangement of FIG. 1), the selection logic 2 selects K2 elements of the set 11 according to the dynamic element matching algorithm of selection logic 2. (The references to elements L1, L2, L3, and L4 in FIG. 3 will be discussed in the next paragraph). The currents of the K1 sources selected by logic 1 are directed, to a first output terminal 13 and the currents of the K2 sources selected by selection logic 2, are directed to a second output terminal 14. Similarly, the conversion elements of the set 12 are selected by both the selection logic 1 and the selection logic 2. The currents of the K2 sources, selected by selection logic 2, are sunk from the first output terminal 13 and the currents of the K1 sources, selected by selection logic 1, are sunk from the second output terminal 14. Consequently, the first output terminal delivers a current K1−K2 and the second output terminal delivers a current K2−K1, so that a real differential output signal 2(K1−K2) is obtained from between the two mentioned output terminals.

As in the arrangement of FIG. 1, it is also important in the arrangement of FIG. 3 to avoid the dynamic element matching algorithms from temporarily stopping their shaping activities and therefore excess conversion elements are selected in this arrangement. The number of these excess elements need not necessarily be equal. As is shown in FIG. 3, in the set 11 K1+L1 conversion elements are selected for connection to output terminal 13 and K2+LA conversion elements are selected for connection to output terminal 14. Similarly, in the set 12 K2+L3 conversion elements are selected for connection to output terminal 13 and K1+L2 conversion elements are selected for connection to output terminal 14. For avoiding that the excess conversion elements contribute to the differential output signal, it is necessary that L1+L2=L3+L4. For also avoiding that the excess conversion elements contribute to the common mode of the output signals it is additionally preferred that L1+L4= L2+L3. The two conditions together imply that L1=L3 and L2=L4. For the reasons already set out with reference to FIG. 1 it is preferred to make all the numbers of excess conversion elements equal to 1.

Each of the m lines from the selection logic 1 or 2 selects one of the m conversion elements in a set. This means that in the arrangement of FIG. 3 the selection of each conversion element is controlled by two lines, one from logic 1 and one from logic 2. It is further noted that each conversion element can be in one of three situations: each element of set 11 can be selected by the algorithm of logic 1, in which case it is connected to the output terminal 13, or it can be selected by the algorithm of logic 2, in which case it is connected to the output terminal 14, or it can be selected by neither one of the two algorithms, in which case its current is dumped to ground.

However a problem arises when both algorithms select the same conversion element simultaneously. That this may easily happen can be seen in the selection scheme of FIG. 2b. In this scheme, during the first conversion the first element is selected by both algorithms and equally during the 4th conversion the 4th element and during the 7th conversion the 1st element. In these cases, the two algorithms want to add the error of that source at the same time to both the output terminals 13 and 14, i.e. the error would be simultaneously added and subtracted from the differential output. Therefore the selection of both can be cancelled. When the selection of both is cancelled, no error is made in the averaging, and all good features of the dynamic element matching algorithm are preserved.

Figure 4:
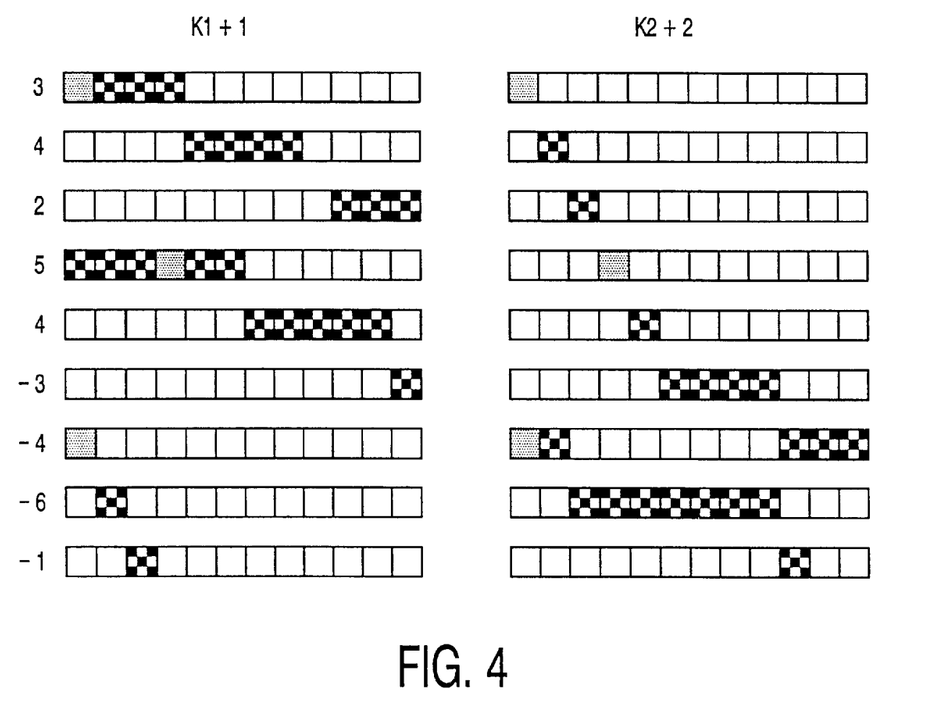

FIG. 4 represents the selection scheme for the arrangement of FIG. 3 with L1=L2 L3=L4=1 and with the same input signal sequence as in FIGS. 2a and 2b. In this FIG. 4 the selected elements are blocked, the originally non-selected elements are blank and the elements of which the selection is cancelled are shaded.

In the dual conversion-set architecture of FIG. 1, the positive signal excursions are made by the "positive" set of conversion elements and the negative signal excursions are made by the "negative" set of conversion elements. When the average value of the conversion elements in each of the two sets is not exactly equal, the circuit is not symmetrical, resulting in even order harmonic distortion in the analog output signal. This distortion, which cannot be dealt with by using a dynamic element matching algorithm, is effectively cancelled in the differential output converter of FIG. 3, because each of the sets of conversion elements perform both the conversion of the positive and of the negative signal excursions. When the four numbers of excess conversion elements are all equal to L and when i+di is the average current of the sources of set 11 and i−di is the average current of the sources of set 12 (the differences between the sources of one set are not taken into account because these are dealt with by the dynamic element matching algorithm) then the current supplied to terminal 13 is (i+di)(K1+L) and the current sunk from terminal 13 is (i−di)(K2+L) so that the resulting current delivered by the output terminal 13 is:

$$(i+di)(K1+L)-(i-di)(K2+L)=i(K1-K2)+di(K1+K2+2L).$$

Further, the current supplied to terminal 14 is (i+di)(K2+ L) and the current sunk from terminal 14 is (i−di)(K1+L) so that the resulting current delivered by the output terminal 14 is:

$$(i+di)(K2+L)-(i-di)(K1+L)=i(K2-K1)+di(K1+K2+2L).$$

Subtracting the two output currents gives the differential output signal 2i(K1−K2) which is free from di-asymmetry errors. Adding the two output currents gives: 2di(K1+K2+ 2L) which shows that the di-asymmetry errors only appear in the common mode of the output signal.

Figure 5:
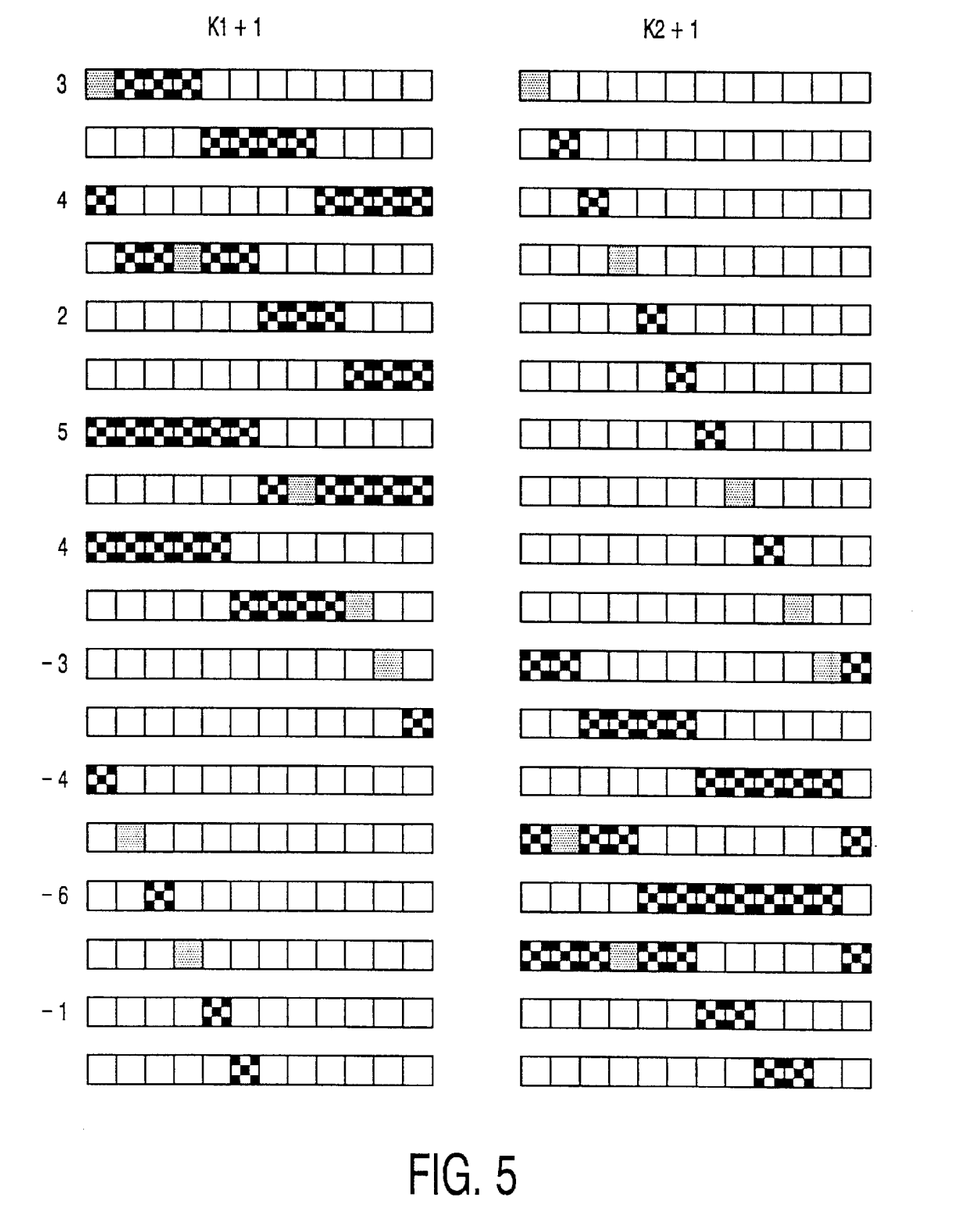

As is the case in many dynamic element matching algorithms, the performance of the dynamic element matching algorithms presented in this application can significantly be improved when the selection of conversion elements is performed more than once per sampling period (preferably an integer times per sampling period) of the digital input signal. With such increased conversion frequency the circulation of selected conversion elements runs much faster, so that the mismatch errors are shaped to still higher frequencies. FIG. 5 shows a conversion element selection scheme for the arrangement of FIG. 3, with a conversion frequency which is twice the sampling frequency and with the same input signal sequence as used in FIGS. 2 and 4.

Although the features and advantages of the present invention, i.e. the reduction of non-linear distortion, the improved shaping of mismatch-noise, the improved signal-symmetry, are only illustrated for the Data Weighted Averaging algorithm, they also hold for other kinds of noise-shaping dynamic element matching algorithms.

What is claimed is:

1. A digital to analog converter for converting a multibit digital input signal into an analog output signal, the converter comprising a set of substantially equal conversion elements of one polarity and conversion element selection logic for selecting, in response to the multibit digital input signal, from said set of conversion elements a number (K1) of signal-conversion elements for connection to an output terminal, the selection logic being adapted to perform a dynamic element matching algorithm, characterized in that the converter further comprises a second set (6) of substantially equal opposite-polarity conversion elements for output-signal excursions which are opposite to the output-signal excursions obtained by the first mentioned set (5) of conversion elements and second conversion-element selection logic (2) for selecting, in response to the multibit digital input signal (Si), from said second set (6) of conversion elements a second number (K2) of signal-conversion elements for connection to the said output terminal (7), the second selection logic (2) being also adapted to perform a dynamic element matching algorithm, further characterized in that the first mentioned selection logic (1) additionally selects, from said first mentioned set (5) of conversion elements, a number (L) of excess conversion elements for connection to the output terminal (7) and that the second selection logic (2) additionally selects, from the second set (6) of conversion elements, an equal number (L) of excess conversion elements for connection to the analog output terminal (7).

2. A digital to analog converter for converting a multibit digital input signal into an analog output signal, the converter comprising a set of substantially equal conversion elements of one polarity and conversion element selection logic for selecting, in response to the multibit digital input signal, from said set of conversion elements a number (K1) of signal-conversion elements for connection to an output terminal, the selection logic being adapted to perform a dynamic element matching algorithm, characterized in that the converter further comprises a second set (6) of substantially equal opposite-polarity conversion elements for output-signal excursions which are opposite to the output-signal excursions obtained by the first mentioned set (5) of conversion elements and second conversion-element selection logic (2) for selecting, in response to the multibit digital input signal (Si), from said second set (6) of conversion elements a second number (K2) of signal-conversion elements for connection to the said output terminal (7), the second selection logic (2) being also adapted to perform a dynamic element matching algorithm for converting a multibit digital input signal into a differential analog output signal, characterized in that the first mentioned selection logic (1) additionally controls the second set (12) of conversion elements, whereby, simultaneously with the connection of the first mentioned number (K1) of signal-conversion elements from the first set (11) to the first mentioned output terminal (13), an equal number of signal-conversion elements is selected from the second set (12) of conversion elements for connection to a second output terminal (14) and that the second selection logic (2) additionally controls the first mentioned set (11) of conversion elements, whereby, simultaneously with the connection of the second number (K2) of signal-conversion elements from the second set (12) to the first mentioned output terminal (13), an equal number of signal-conversion elements from the first set (11) is selected for connection to the second output terminal (14), further characterized in that the first mentioned selection logic (1) additionally selects, from said first mentioned set of conversion elements (11) a first number (L1) of excess conversion elements for connection to the first mentioned output terminal (13), that the first mentioned selection logic (1) additionally selects, from said second set of conversion elements (12) a second number (L2) of excess conversion elements for connection to the second output terminal (16), that the second selection logic (2) additionally selects, from said second set of conversion elements (12) a third number (L3) of excess conversion elements for connection to the first mentioned output terminal (13), that the second selection logic (2) additionally selects, from said first mentioned set of conversion elements (11) a fourth number (L4) of excess conversion elements for connection to the second output terminal (14) and that the sum of the first number (L1) of excess conversion elements and the second number (L2) of excess conversion elements is equal to the sum of the third number (L3) of excess conversion elements and the fourth number (L4) of excess conversion elements.

3. A digital to analog converter as claimed in claim 1 or 2, characterized in that each of the mentioned numbers of excess conversion elements is equal to 1.

4. A digital to analog converter as claimed in claim 2, characterized by means to compare the operation of the two selection logics with each other to identify any conversion element which is scheduled for simultaneous selection by both selection logics and to cancel the selection of such conversion element by each of the two selection logics.

* * * * *